United States Patent [19]
Lee et al.

[11] Patent Number: 6,074,887
[45] Date of Patent: *Jun. 13, 2000

[54] METHOD FOR FABRICATING MOSFET-CONTROLLED FEA

[75] Inventors: Jong Duk Lee, Department of Electronics Engineering College of Engineering, Seoul National University, ShinLim-dong, Kwanak-ku; Donghwan Kim, Seoul, both of Rep. of Korea

[73] Assignees: Korean Information & Communication Co., Ltd.; Jong Duk Lee, both of Seoul, Rep. of Korea

[*] Notice: This patent is subject to a terminal disclaimer.

[21] Appl. No.: 08/937,527

[22] Filed: Sep. 27, 1997

[30] Foreign Application Priority Data

Jul. 2, 1997 [KR] Rep. of Korea ............... 97-30569

[51] Int. Cl.[7] .................................................. H01L 21/00
[52] U.S. Cl. ............................ 438/34; 438/20; 438/22; 438/23; 438/28

[58] Field of Search ...................... 257/57, 10, 11, 257/288, 291; 438/28, 34, 20, 22, 23, 648, 197, 217; 313/309, 310

[56] References Cited

U.S. PATENT DOCUMENTS

| | | | |
|---|---|---|---|
| 5,359,256 | 10/1994 | Gray | 313/169 |
| 5,651,713 | 7/1997 | Lee et al. | 445/50 |
| 5,731,597 | 3/1998 | Lee et al. | 257/10 |
| 5,780,318 | 7/1998 | Hirano et al. | 438/20 |
| 5,872,019 | 2/1999 | Lee et al. | 438/20 |
| 5,910,701 | 6/1999 | Takemura | 313/309 |

*Primary Examiner*—Mahshid Saadat
*Assistant Examiner*—N. Drew Richards
*Attorney, Agent, or Firm*—Dilworth & Barrese

[57] ABSTRACT

The present invention is directed to fabricating a MOSFET-controlled FEA, in which the emitter array and the cathode electrode are separated and connected to each other by a MOSFET, the cathode electrode and the n-well beneath the emitter array thereby being used as a source and a drain of the MOSFET.

4 Claims, 3 Drawing Sheets

METHOD FOR FABRICATING MOSFET-CONTROLLED FEA

BACKGROUND OF THE INVENTION

1. Field of the Invention

The present invention relates to a MOSFET-controlled FEA and a method for fabricating the same, and more particularly to a MOSFET-controlled FEA in which the FEA and its cathode electrode are formed apart and connected to each other by a MOSFET, thereby improving uniformity in the emission current of the FEA and stabilizing the emission current.

2. Description of the Prior Art

FEAs have been extensively investigated as powerful electron sources for FED, one of the most promising technology for FPD, but have serious problems such as current instability and nonuniformity due to the structural variation of emitters and surface reaction with residual gas on their tips.

Generally, FED is comprised of FEAs to emit electrons and a circuit for driving the FEAs. An FEA and its driver circuit are separately fabricated and then interconnected with each other to form a display module, which necessitate additional fabricating process and cost. Additionally, there are difficulties in reducing the driving voltage for the FEA and obtaining the uniformity of pixels.

To overcome the above-mentioned problems, the inventors could make an FEA incorporated with MOSFETs and method for fabrication the same, which is disclosed in the U.S. patent application Ser. No. 08/717,789. The disclosed invention was intended to fabricate the silicon-FEA and the metal-FEA simultaneously with MOSFETs by using the conventional thermal silicon oxidation method and the local oxidation of silicon (LOCOS) method, respectively. After the above invention had been completed, we have focused on a cathode structure of Si-based FEA with a MOSFET to improve the emission uniformity and to stabilize the emission current in the FED. As the result, the present invention has been made.

SUMMARY OF THE INVENTION

An object of the present invention is to provide a MOSFET-controlled FEA and a method for fabricating the same, thereby not only achieving a stable emission current, but also improving pixel-to-pixel emission uniformity.

In order to accomplish the object, the present invention is intended to fabricate a MOSFET-controlled FEA, in which the emitter array and the cathode electrode are separated and connected to each other by a MOSFET, thereby the cathode electrode and the n-well beneath the emitter array are used as a source and a drain of the MOSFET.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS

Now, preferred embodiments of the present invention will be described with reference to the accomplishing drawings.

Embodiment 1

FIG. 1A to 1J show sequential steps of fabricating a MOSFET-controlled FEA according to the first embodiment of the present invention.

Figure 1A:
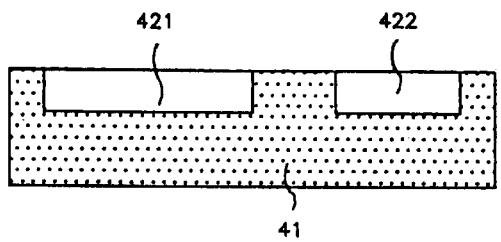
FIGS. 1A to 1J are sectional views respectively illustrating sequential steps of fabricating a MOSFET-controlled FEA according to an embodiment of the present invention.

In this embodiment, a boron-doped (100)-oriented silicon substrate 41 with a resistivity of 15 $\Omega\cdot$cm is first prepared and then n+-doped silicon layers 421 and 422 are formed in a certain portion of the p-type silicon substrate 41 by an appropriate method such as POCl3 doping, as shown in FIG. 1A. The formed n+-doped silicon layer 422 may be served as a cathode electrode and the n+-doped silicon layer 421 may be used for formation of an field emission tip.

Figure 1B:
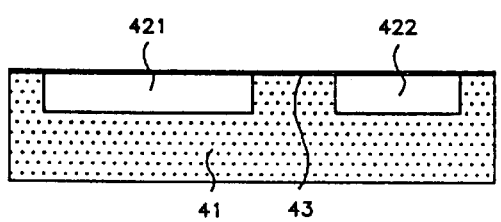
Figure 1C:
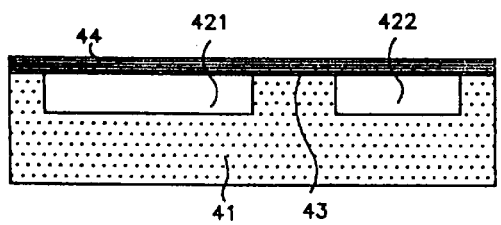

Over the n+-doped silicon layers 421 and 422 and p-type silicon substrate 41, a buffer oxide layer 43 with a thickness of 25 nm is then formed by dry oxidation as shown in FIG. 1B and a silicon nitride film 44 with a thickness of 200 nm is deposited by LPCVD as shown in FIG. 1C.

Figure 1D:
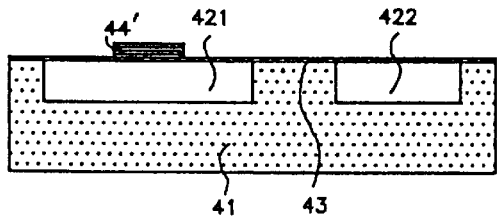

Then, the nitride film 44 is patterned into a disc on the n+-doped silicon layer 421 by Reactive Ion Etching (RIE) as shown in FIG. 1D.

Figure 1E:
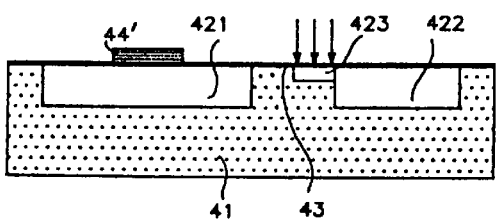
Figure 1F:
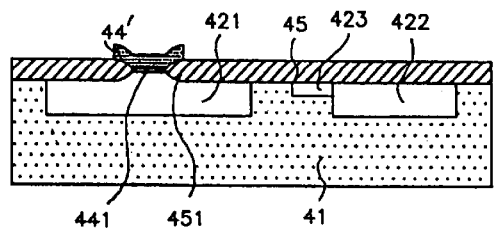

The boron ion implantation is carried out over a selected region of the buffer oxide layer 43 to adjust the threshold voltage of the MOSFET to be made. In this step, the ion-implanted region is spaced away from the n+-doped silicon layer 421 but located adjacent to the n+-doped silicon layer 422 so that the region around the n+-doped silicon layer 421 may be low doped and the breakdown voltage of the well-substrate junction may increase. As the result of the selected boron ion implantation, a doped channel 423 is formed (FIG. 1E ). Then the substrate is thermally oxidized so that a grown oxide layer 45 is formed to a thickness of 600 nm and 450 nm on the n+-doped silicon layers 421, 422 and the p-type silicon substrate 41, respectively. In this step, an oxide layer 451 having a bird's beak shape is formed beneath the nitride disc 44 and it reduces gate hole diameter of the FEA to be made. The grown oxide layer on the n+-doped silicon layer 421 serves as a gate oxide layer of the FEA and the grown oxide layer on the p-type silicon substrate 41 serves as a gate insulator of the MOSFET (FIG. 1F).

Figure 1G:
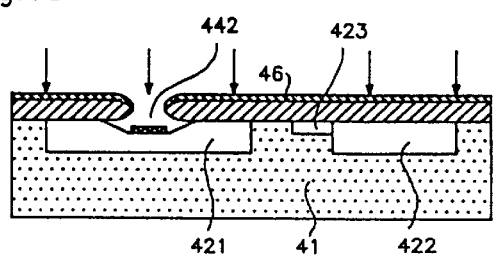
Figure 1H:
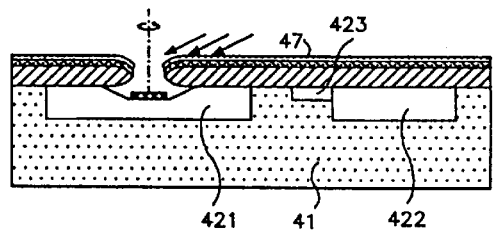
Figure 1I:
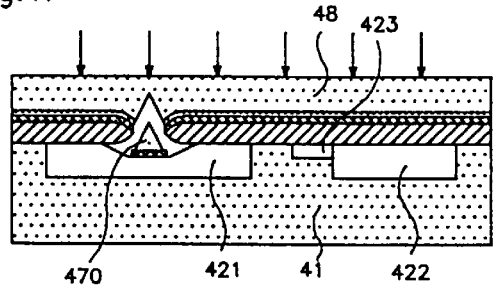
Figure 1J:
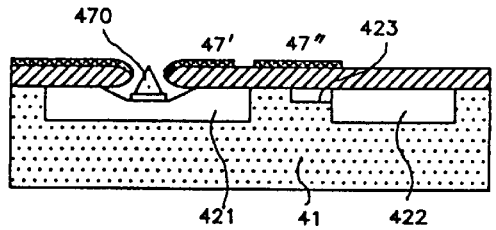

As shown in FIG. 1G , the nitride disc 44 is removed by phosphoric acid and the thin oxide layer 441 beneath the nitride disc 44 is successively etched by RIE. exposed portion of the silicon layer 421 is isotropically etched away and by RIE using SF6 to form at least one gate hole 442. Then, molybdenum is deposited perpendicularly over the surface of the grown oxide layer 45 and the gate hole 442 by an E-gun evaporator. Niobium, chromium or hafnium may be used as the deposition material instead of the molybdenum, but the deposition materials are not limited to those as above. The molybdenum layer 46 may be used as the gate metal of the FEA and as the gate metal of the MOSFET. Then, aluminum is deposited at a grazing angle to the molybdenum layer 46 to form a parting layer 47 using an E-gun evaporator, as shown in FIG. 1H. As the disposition material of the parting layer 47, aluminum oxide or nickel may be used instead of the aluminum. Thereafter, as at least one field emission tip 470 is formed in a injecting a molybdenum perpendicularly with respect to the surface of the parting layer 47, the gap between the adjacent gate electrode layers are gradually reduced and finally closed as the deposition of the molybdenum metal advances. As a result, the at least one field emission tip 470 is formed in a cone shape, as shown in FIG. 1I. Subsequently the parting layer 47 is selectively etched away by using the KOH solution, and thus, the upper molybdenum layer 48 deposited over the parting layer 47 is lifted off from the substrate together with the parting layer 47. Then, the lower molybdenum layer 46 is patterned into a gate electrode 47' of the FEA and a gate electrode 47" of the MOSFET, thus a MOSFET-controlled FEA having the structure shown in FIG. 1J is obtained.

Embodiment 2

FIG. 2A to 2K show sequential steps of fabricating a MOSFET-controlled FEA according to the second embodiment of the present invention.

Figure 2A:
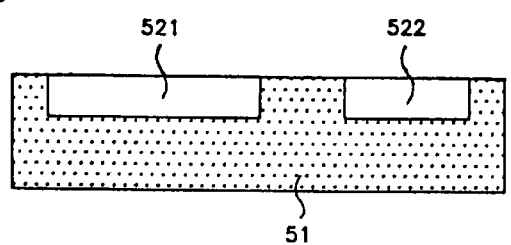
FIGS. 2A to 2K are sectional views respectively illustrating sequential steps of fabricating a MOSFET-controlled FEA according to another embodiment of the present invention.
Figure 2B:
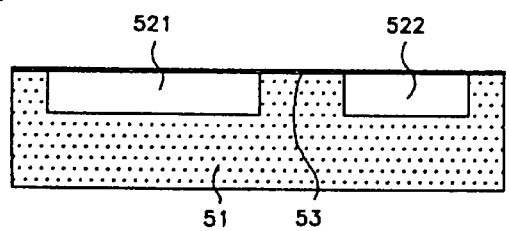
Figure 2C:
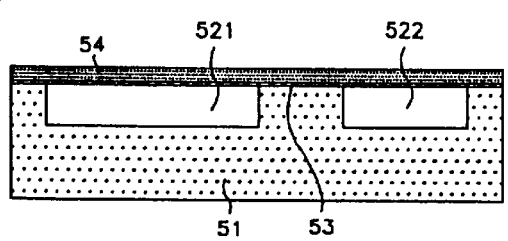

First, a boron-doped (100)-oriented silicon substrate 51 with a resistivity of 15 Ω·cm is prepared and then n+-doped silicon layers 521 and 522 are formed in a certain portion of the p-type silicon substrate 51 by an appropriate method such as POCl3 doping, as shown in FIG. 2A. The n+-doped silicon layer 522 may be served as a cathode electrode and the n+-doped silicon layer 521 may be used for formation of at least one field emission tip. Over the n+-doped silicon layers 521 and 522 and the p-type silicon substrate 51, a buffer oxide layer 53 with a thickness of 25 nm is then formed by dry oxidation as shown in FIG. 2B and a silicon nitride film 54 with a thickness of 200 nm is deposited by LPCVD as shown in FIG. 2C.

Figure 2D:
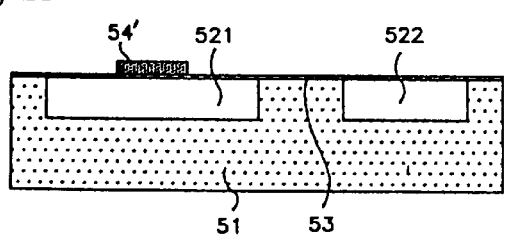

Then, the nitride film 54 is patterned into a disc on the n+-doped silicon layer 521 by RIE, as shown in FIG. 2D.

Figure 2E:
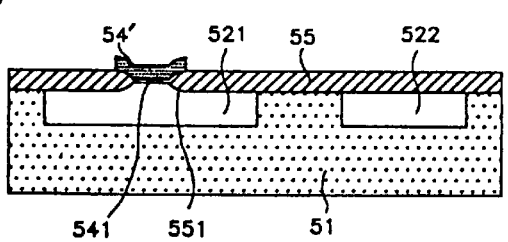
Figure 2F:
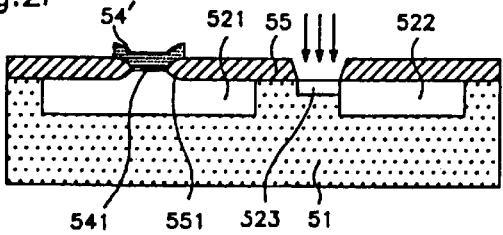
Figure 2G:
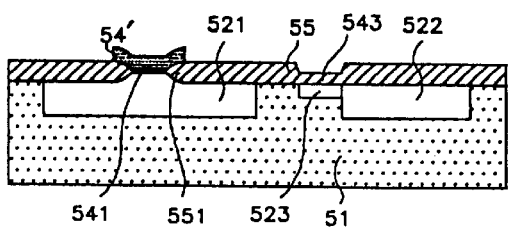
Figure 2H:
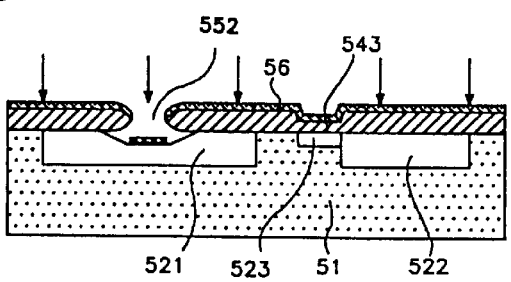
Figure 2I:
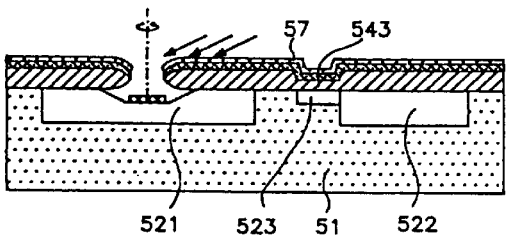
Figure 2J:
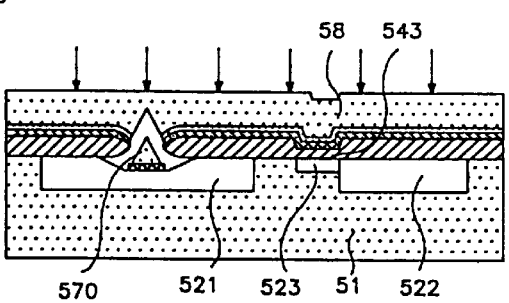

Thereafter, the substrate is thermally oxidized so that a grown oxide layer 55 is formed to a thickness of 600 nm and 450 nm on the n+-doped silicon layers 521 and 522 and the p-type silicon substrate 51, respectively. In this step, an oxide layer 551 having a bird's beak shape 551 is formed beneath the nitride disc 54 and it reduces the gate hole diameter. The grown oxide layer 55 on the n+-doped silicon layer 521 serves as a gate oxide layer of the FEA to be made (FIG. 2E). Then, a selected region of the grown oxide layer 55 is etched, and boron ion implantation is carried out over the etched region to form a doped channel 523 as shown in FIG. 2F. In this step, the etched and implanted region is spaced away from the n+-doped silicon layer 521 but located adjacent to the n+-doped silicon layer 522 so that the region around the n+-doped silicon layer 521 may be low doped and the breakdown voltage of the well-substrate junction may increase. Then, a gate oxide layer 543 of the MOSFET is grown by dry oxidation (FIG. 2G).

Figure 2K:
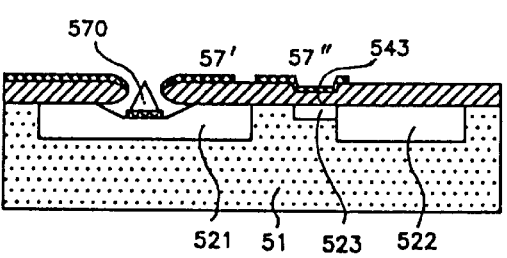

As shown in FIG. 2H to 2K, the subsequent steps are carried out as the first embodiment and thus a MOSFET-controlled FEA having the structure of with the cross-sectional view shown in FIG. 2K is obtained.

Figure 3A:
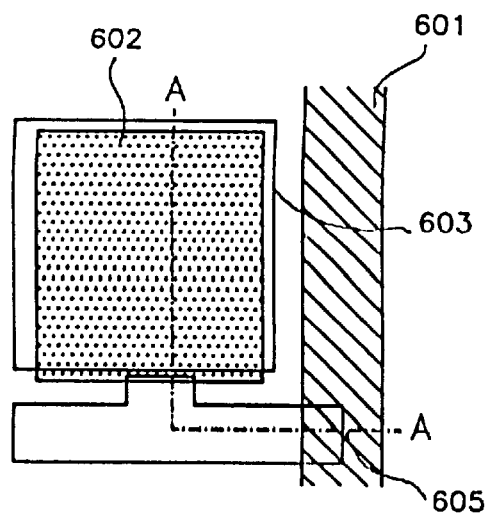
FIG. 3A is a top view of a MOSFET-controlled FEA according to the present invention.
Figure 3B:
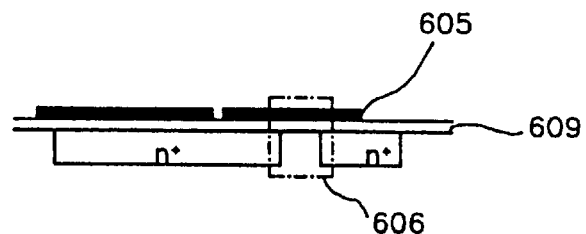
FIG. 3B is a cross-sectional view along the line A—A of FIG. 3A.
Figure 4:
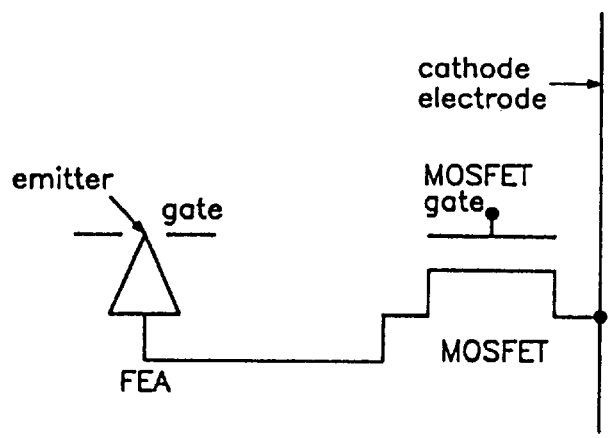
FIG. 4 is an equivalent circuit of the MOSFET-controlled FEA of FIG. 3A.

FIG. 3A is a top view of a MOSFET-controlled FEA according to the present invention and FIG. 3B is a cross-sectional view along the line A—A of FIG. 3A.

while FIG. 4 is an equivalent circuit of the MOSFET-controlled FEA of FIG. 3A.

As shown in FIG. 3A, FIG. 3B and FIG. 4, the MOSFET 606 is formed between a cathode electrode 601 and an emitter array 602, and the cathode electrode 601 and the emitter array 602 are used as a source and a drain of the MOSFET 606, respectively. Ref. Nos. 603, 605 and 609

As apparent from the above description, the present invention provides an MOSFET-controlled FEA in which the FEA and its cathode electrode are formed apart and connected to each other by a MOSFET, thereby enabling the control of the emission current from the FEA by the MOSFET. In addition, improvement in the pixel-to-pixel emission uniformity is possible and the MOSFET-controlled FEA has stable emission current.

It is also possible to eliminate an additional process required for connecting the FEAs and MOSFETs. Accordingly, a substantial reduction in the manufacturing cost of the FED is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MOSFET-controlled FEA, which comprises the steps of:

forming a first and a second n+-doped silicon layers over a p-type silicon substrate by diffusion of n+ ions;

forming a buffer oxide layer over the first and the second n+-doped silicon layers and the p-type substrate by dry oxidation;

depositing a silicon nitride layer over the buffer oxide layer by LPCVD and patterning the nitride film by RIE into a disc on the first n+-doped silicon layer;

implanting boron ions over a selected region of the oxide layer that is spaced away from the first n+-doped silicon layer but located adjacent to the second n+-doped silicon layer to form a doped channel;

oxidizing the buffer oxide layer to form a gate oxide layer except for the portion beneath the nitride disc;

removing the nitride disc by acid and etching the buffer oxide layer beneath the nitride disc by RIE;

isotropically etching the exposed portion of the first n+-doped silicon layer by RIE to form gate holes;

depositing a metal perpendicularly over the silicon substrate to form a gate layer;

depositing a parting material at a grazing angle to the gate layer to form a parting layer and depositing molybdenum perpendicularly with respect to the surface of the parting layer to form emitter tips;

removing the parting layer selectively;

patterning the gate layer into gate electrodes of the FEA and a gate electrode of the MOSFET.

2. A method for fabricating a MOSFET-controlled FEA, which comprises the steps of:

forming a first and a second n+-doped silicon layers over a p-type silicon substrate by diffusion of n+ ions;

forming a buffer oxide layer over the first and the second n+-doped silicon layers and the p-type substrate by dry oxidation;

depositing a silicon nitride layer over the buffer oxide layer by LPCVD and patterning the nitride film by RIE into a disc on the first n+-doped silicon layer;

oxidizing the buffer oxide layer to form a gate oxide layer except for the portion beneath the nitride disc;

etching the gate oxide layer on a selected region that is spaced away from the first n+-doped silicon layer but located adjacent to the second n+-doped silicon layer and implanting boron ions over the etched region to form a doped channel;

forming an oxide layer on the doped channel;

removing the nitride disc by acid and etching the buffer oxide layer beneath the nitride disc by RIE;

isotropically etching the exposed portion of the first n+-doped silicon layer by RIE to form gate holes;

depositing a metal perpendicularly over the silicon substrate to form a gate layer;

depositing a parting material at a grazing angle to the gate layer to form a parting layer and depositing molybdenum perpendicularly with respect to the surface of the parting layer to form emitter tips;

removing the parting layer selectively;

patterning the gate layer into gate electrodes of the FEA and a gate electrode of the MOSFET.

3. A method for fabricating a MOSFET-controlled FEA according to claim 1, in which thickness of the gate oxide layer of the first n+-doped silicon layer differs from that of the gate oxide layer of the second n+-doped silicon layer.

4. A method for fabricating a MOSFET-controlled FEA according to claim 2, in which thickness of the gate oxide layer of the first n+-doped silicon layer differs from that of the gate oxide layer of the second n+-doped silicon layer.

* * * * *